United States Patent
Kim et al.

(10) Patent No.: US 7,916,569 B2
(45) Date of Patent: *Mar. 29, 2011

(54) DYNAMIC RANDOM ACCESS MEMORY WITH FULLY INDEPENDENT PARTIAL ARRAY REFRESH FUNCTION

(75) Inventors: Jin-Ki Kim, Kanata (CA); HakJune Oh, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 3 days.

This patent is subject to a terminal disclaimer.

(21) Appl. No.: 12/339,946

(22) Filed: Dec. 19, 2008

(65) Prior Publication Data

US 2009/0103383 A1    Apr. 23, 2009

Related U.S. Application Data

(63) Continuation of application No. 11/412,783, filed on Apr. 28, 2006, now Pat. No. 7,492,656.

(51) Int. Cl.
*G11C 7/00*    (2006.01)
(52) U.S. Cl. ............... 365/222; 365/189.05; 365/189.12
(58) Field of Classification Search .................. 365/222, 365/189.05, 230.03, 189.12
See application file for complete search history.

(56) References Cited

U.S. PATENT DOCUMENTS

| | | | |
|---|---|---|---|
| 6,490,215 B2 * | 12/2002 | Komura et al. | 365/222 |
| 6,529,435 B2 * | 3/2003 | Yagishita et al. | 365/189.03 |
| 6,590,822 B2 | 7/2003 | Hwang et al. | |
| 6,646,941 B1 | 11/2003 | Atwell et al. | |
| 6,721,223 B2 * | 4/2004 | Matsumoto et al. | 365/222 |
| 6,912,168 B2 | 6/2005 | Parris et al. | |
| 2004/0047205 A1 | 3/2004 | Hazama et al. | |
| 2005/0152200 A1 | 7/2005 | Lee et al. | |

OTHER PUBLICATIONS

Micron Technology, Inc.,; Mobile SDRAM, 256Mb: x32 Mobile SDRAM, 2003, pp. 1-75.

* cited by examiner

*Primary Examiner* — Son Dinh

(57) ABSTRACT

A dynamic random access memory device includes a plurality of memory subblocks. Each subblock has a plurality of wordlines whereto a plurality of data store cells are connected. Partial array self-refresh (PASR) configuration settings are independently made. In accordance with the PASR settings, the memory subblocks are addressed for refreshing. The PASR settings are made by a memory controller. Any kind of combinations of subblock addresses may be selected. Thus, the memory subblocks are fully independently refreshed. User selectable memory arrays for data retention provide effective memory control programming especially for low power mobile application.

6 Claims, 15 Drawing Sheets

DYNAMIC RANDOM ACCESS MEMORY WITH FULLY INDEPENDENT PARTIAL ARRAY REFRESH FUNCTION

RELATED APPLICATION

This application is a continuation of application Ser. No. 11/412,783, filed Apr. 28, 2006, the disclosure of which is expressly incorporated herein by reference in its entirety.

FIELD OF THE INVENTION

The present invention relates generally to semiconductor integrated circuits, and more specifically to dynamic random access memories with a partial array refresh function.

BACKGROUND OF THE INVENTION

In dynamic random access memory (DRAM) integrated circuit devices, a DRAM cell array is typically arranged in rows and columns such that a particular DRAM cell is addressed by specifying its row and column within the array. A wordline connects a row of cells to a set of bitline sense amplifiers that detect the data in the cells. In a read operation, a subset of the data in the bitline sense amplifiers is then chosen, or "column-selected" for output. DRAM cells are "dynamic" in the sense that the stored data, typically in the form of charged and discharged storage capacitors, will dissipate after a relatively short period of time. Thus, in order to retain the information, the contents of the DRAM cells must be refreshed. The charged or discharged state of the storage capacitor must be reapplied to an individual memory cell in a repetitive manner. The maximum amount of time allowable between refreshing operations is determined by the charge storage capabilities of the storage capacitors that make up the DRAM cell array. DRAM manufacturers typically specify a refresh time for which it guarantees data retention in the DRAM cells.

A refresh operation is similar to a read operation, but no data is output. The sensing of the data in the cells by the bitline sense amplifiers is followed by a restoring operation that results in the data being rewritten to the cells. The data is, thus, "refreshed". The refresh operation is performed by enabling a wordline according to a row address, and enabling a bitline sense amplifier. In addition, the refresh operation may be carried out by operating the bitline sense amplifier without receiving an external refresh address. In this case, a refresh address counter, which is integrated in a DRAM device chip, generates a row address subsequent to receiving an external refresh command. It is well known that DRAM cells are refreshed by self-refresh function to retain stored data. The self-refresh function is one of performing refresh operations automatically within the DRAM when in a "standby" mode to retain the data written in its memory cells.

In low power DRAM devices for mobile applications, power consumption during a standby or sleep mode is critical. A major portion of power consumption during the standby or sleep mode is for refresh operation to retain data. Hence, the key for power reduction during the standby or sleep mode is to reduce the refresh frequency. In low power DRAM devices, one of the available power reduction features is a partial refresh that restricts refresh and self-refresh operation during the standby or sleep mode to a portion of the total memory array. This feature enables the device to reduce refresh current by refreshing only that part of the memory array required by a host system. That technique is a "partial array refresh" that supports array selections of ¼ array, ½ array or ¾ array with fixed array location. For example, a partial array self-refresh power-saving function with a low power extended mode register is known (see, for example, Micron® 256 Mb:x32, MOBILE SDRAM, data sheet).

In known partial array self-refresh scheme, a fixed and pre-determined partial array selection is performed as per mode register settings. It does not, thus, perform flexible combinations of array selection for power saving. In DRAM devices which are partitioned as "banks", "subblocks" or "sub-arrays", the bank, subblock or sub-array addresses are key performance factors to achieve faster accesses to partial array memories. It is a simple solution, without DRAM performance degradation, to limit partial array self-refresh feature in low power DRAM devices. Therefore, the fixed and pre-determined scheme is a good compromise between the power saving and the DRAM performance.

A simplified conventional DRAM device is shown in FIG. 1. Referring to FIG. 1 that shows an example DRAM device, a memory controller (not shown) provides it with commands and addresses for DRAM operation. The DRAM device has a full memory block consisting of four banks 112-0, 112-1, 112-2 and 112-3. An external command controller 121, which is synchronized with clocks, includes a command decoder that interprets the commands and generates a refresh request signal 123 indicating whether the memory blocks are to be refreshed or not. The commands include EMRS (extended mode register set) commands. When the EMRS commands are fed to the external command controller 121, an EMRS signal 125 is provided by the command decoder thereof.

An extended mode register 131 writes information carried on selection addresses "A[0:2]" therein in accordance with mode register set commands BA[0:1]. The selection addresses "A[0:2]" give instructions for the partial array self-refresh (PASR) configuration. Once the PASR configuration information is written into the extended mode register 131, it provides a PASR signal 133, the bits of which indicate whether "full array" should be refreshed or partial array should be refreshed in the self-refresh mode. In response to the refresh request signal 123 and the PASR signal 133, an internal bank address counter 135 generates an internal bank address signal 137 containing internal bank addresses that are fed to a multiplexer 141.

Also, the mode register set commands BA[0:1] are latched by an external bank address latch 143. In accordance with the latched addresses, the external bank address latch 143 provides an external bank address signal 145 containing external bank addresses to the multiplexer 141. The multiplexer 141 selects the internal bank addresses or the external bank addresses in response to the refresh request signal 123.

In response to "1" or "0" of the refresh request signal 123, the multiplexer 141 selects the internal bank addresses of the internal bank address signal 137 or the external bank addresses of the external bank address signal 145. The selected addresses are fed to a bank address decoder 151 which in turn provides a decoded address signal 153 to the full memory block consisting of four banks 112-0, 112-1, 112-2 and 112-3. The decoded address signal 153 contains four bank select signals 154-0, 154-1, 154-2 and 154-3. Therefore, the bank address decoder 151 enables one of the four bank select signals 154-0, 154-1, 154-2 and 154-3.

In accordance with the mode register set commands BA[0:1] and the selection addresses "A[0:2]", the banks are designated as shown in following Table 1:

TABLE 1

| A[2] | A[1] | A[0] | Banks to be Self-Refreshed |
|---|---|---|---|
| 0 | 0 | 0 | Four Banks |
| 0 | 0 | 1 | Two Banks (e.g., Bank [0] and [1]) |
| 0 | 1 | 0 | One Bank (e.g., Bank [0]) |

In the DRAM device shown in FIG. 1, the PASR supports only the array selections of ¼ array (i.e., one bank), ½ array (i.e., two banks) or ¾ array (i.e., three banks) with fixed array location. The DRAM device has ability to save power consumption in the self-refresh mode, however it lacks of controllability of selecting which memory bank will be retained in the self-refresh mode. Such a low power DRAM design with the EMRS function allows a full memory array, a half memory array or a ¼ memory array to be selected. When a ¼ memory array is selected for self-refresh mode, for example, the DRAM device enables least significant banks for the selection of a ¼ memory. It may not, thus, be possible to select the other memory banks for specific data retention. It may also not be possible to select another combination of banks, for example bank [0] and bank [3], for the self-refresh mode.

SUMMARY OF THE INVENTION

It is an object of the present invention to provide an improved dynamic random access memory (DRAM) device with an independent partial array refresh function.

In accordance with one aspect, there is provided a dynamic random access memory (DRAM) device including a memory having M memory subblocks, M being an integer greater than one. Each subblock has a plurality of wordlines. Each wordline is connected to a plurality of data store cells. The cells are refreshed by refresh operation. Also, the DRAM device includes a refresh circuit for controlling in a refresh mode the refreshing of the memory subblocks in accordance with M subblock refresh data independently set.

Advantageously, the refresh circuit includes a configuration circuit for configuring the M subblock refresh data in response to input data. The M subblock refresh data is independently set by the input data. For example, the configuration circuit includes a latch circuit for holding the input data. The M subblock refresh data is produced in accordance with the held input data. The latch circuit may include M latching circuits for latching the M subblock refresh data. Each of the M latching circuit latches the respective one of the M subblock refresh data independently.

In accordance with another aspect, there is provided a method for refreshing a dynamic random access memory device including M memory subblocks, M being an integer greater than one, each subblock having a plurality of wordlines, each wordline being connected to a plurality of data store cells, the cells being refreshed in a refresh mode. The method including controlling in a refresh mode the refreshing of the memory subblocks in accordance with M subblock refresh data independently set.

For example, the step of controlling includes the step of configuring the M subblock refresh data in response to input data, the M subblock refresh data being independently set by the input data. The step of configuring includes the step of holding the input data, the M subblock refresh data being produced in accordance with the held input data.

Advantageously, the method further includes the step of providing an address signal for selecting the subblock.

In accordance with a further aspect, there is provided a refresh controller for use in a dynamic random access memory device selectively operated in a refresh mode and a non self-refresh mode, the DRAM device including M memory subblocks, M being an integer greater that one. Each subblock has a plurality of wordlines. Each wordline is connected to a plurality of data store cells. The cells are refreshed in a refresh mode. The refresh controller includes a refresh circuit for controlling in refresh mode the refreshing of the memory subblocks in accordance with M subblock refresh data independently set.

Advantageously, the refresh controller further includes a configuration circuit for configuring the M subblock refresh data in response to input data, the M subblock refresh data being independently set by the input data.

For example, the configuration circuit includes a latch circuit for holding the input data, the M subblock refresh data being produced in accordance with the held input data.

In accordance with embodiments of the present invention, there is provided a DRAM device and a method for refreshing memory cells fully independent partial array refresh and self-refresh based on minimum compliable array size. Any kind of array combination can be selected and refreshed by input data selection. In the embodiments, unlimited controllability of array selection is achieved for refresh and self-refresh. Configurable partial array registration is performed by data input. The embodiments of the present invention achieve advantages; flexibility of selection of memory array blocks; unlimited combination of arrays for refresh and self-refresh; user selectable arrays for data retention provides effective memory control programming especially for low power mobile application.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Figure 1:
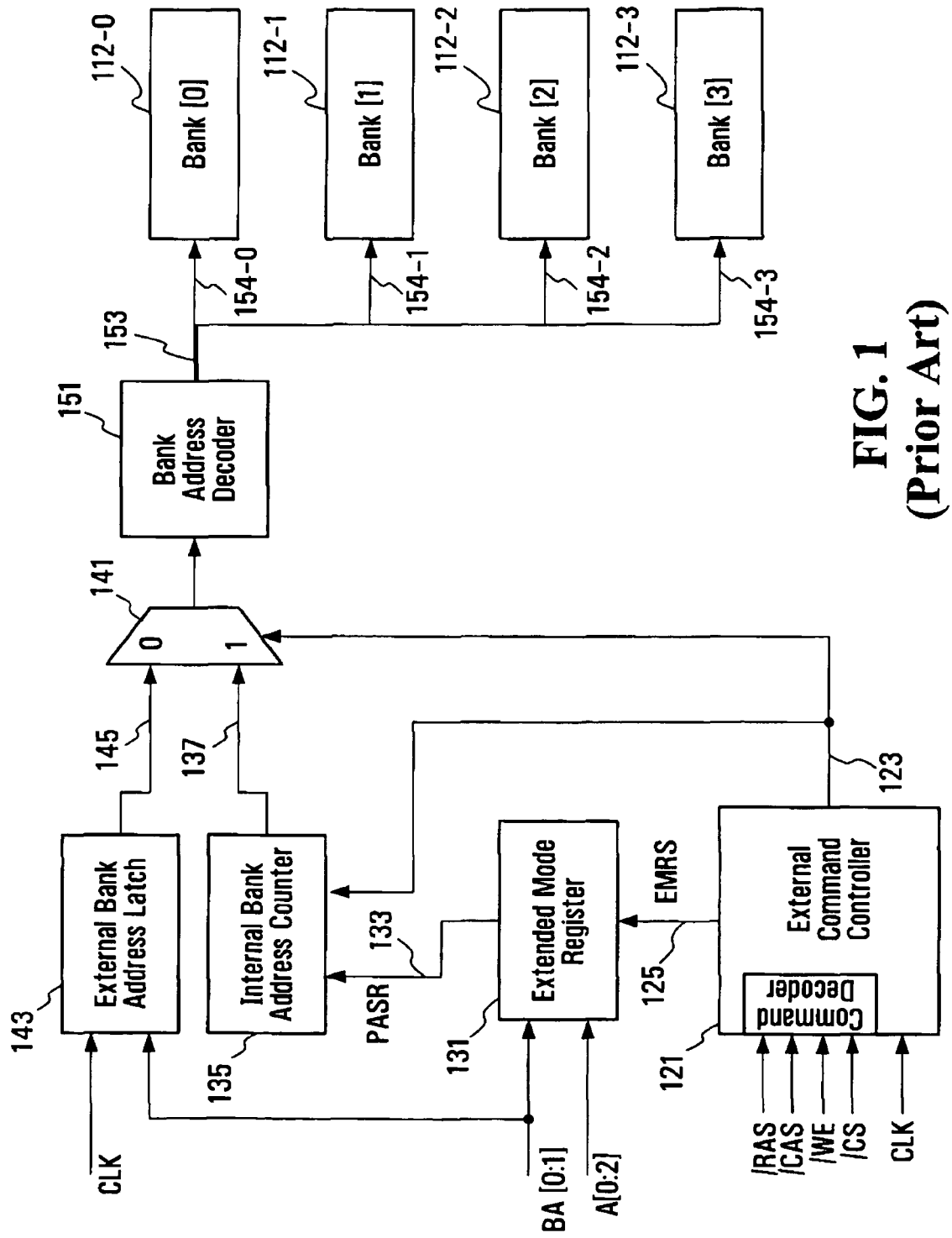
FIG. 1 is a schematic diagram illustrating a conventional address controller found in a dynamic random access memory (DRAM) device with a partial array self-refresh function.
Figure 2:
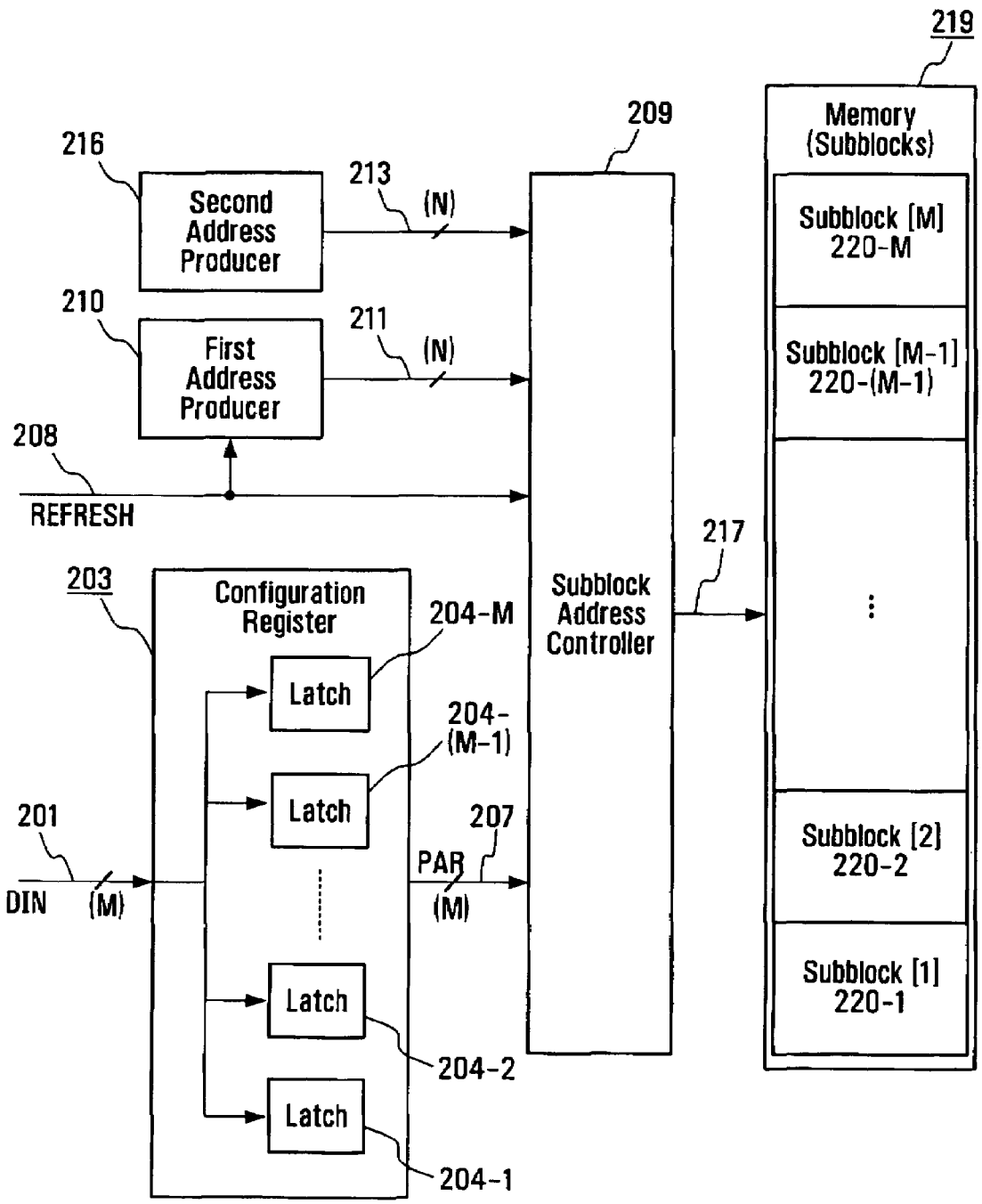
FIG. 2 is a schematic diagram illustrating a DRAM device according to one embodiment of the present invention.

Generally, the present invention provides the refreshing of memory cells within an array included in a dynamic random access memory (DRAM) device. The present invention applied to a DRAM device will now be described, the DRAM device having the function of refreshing DRAM cells. Embodiments according to the present invention will be described DRAM devices performing the self-refresh function, that is, a partial array self-refresh (PASR). Some embodiments of the present invention will also be applicable to the normal refresh function, that is, a partial array refresh (PAR). FIG. 2 shows a DRAM device according to one embodiment of the present invention. Referring to FIG. 2, a data input signal 201 containing subblock selection input data DIN[1:M] is provided to a partial array refresh (PAR) configuration register 203. The PAR configuration register 203 includes M latches 204-1-204-M. The subblock selection input data DIN includes M data corresponding to the number of memory subblocks. M is an integer greater than one. The PAR configuration register 203 provides a PAR setting signal 207 to a subblock address controller 209. A refresh signal "REFRESH" 208 is provided to the subblock address controller 209. In response to the refresh signal 208, a first address producer 210 produces a first address (e.g., an internal address) signal 211 represented by N bits that is provided to the subblock address controller 209. In some embodiments, each permutation of the N bits (e.g., four bits) is associated with one of the M subblocks (e.g., 16 subblocks). Also, a second address producer 216 produces a second address (e.g., an external address) signal 213 represented by N bits that is provided to the subblock address controller 209. The subblock address controller 209 provides a subblock address signal 217 to a memory 219 that is divided to M subblocks 220-1-220-M. When the refresh signal 208 indicates the refresh mode, the internal address signal 211 is provided.

Each of the M data in the subblock selection input data DIN is latched or held in the respective one of the M latches 204-1-204-M. The latches 204-1-204-M produce M PAR configuration data of the PAR setting signal 207. In response to the refresh signal 208, the subblock address controller 209 produces the subblock addresses SubAd[1:M] to be contained in the subblock address signal 217, in accordance with the second address signal 213 or with the PAR setting signal 207 and the first address signal 211. More particularly, if the refresh signal 208 is in the "REFRESH" state, then the first address signal 211 is used, and otherwise the second address signal 213 is used. The produced subblock addresses designate or select memory subblocks to be refreshed from the subblocks 220-1-220-M. When the refresh signal 208 represents the self-refresh request, the designated subblocks 220-1-220-M of the memory 219 are self-refreshed. When the subblock address signal 217 represents the normal refresh request, the designated subblocks 220-1-220-M of the memory 219 are refreshed during the normal operations. The subblock selection input data DIN of the data input signal 201 is independently set in the latches 204-1-204-M of the PAR configuration register 203. The data of the PAR setting signal 207 is independently set from the others. The subblocks 220-1-220-M of the memory 219 are independently designated or selected. Thus, a fully independently partial array refresh function is achieved.

More detailed embodiments of DRAM devices will be described. In the following embodiments according to the present invention, the logic "high" and "low" states of the signals are represented by two different voltages V1 and V2 (<V1). For example, the voltages V1 and V2 are "high" and "low" supply voltages VDD and VSS, respectively.

Figure 3:
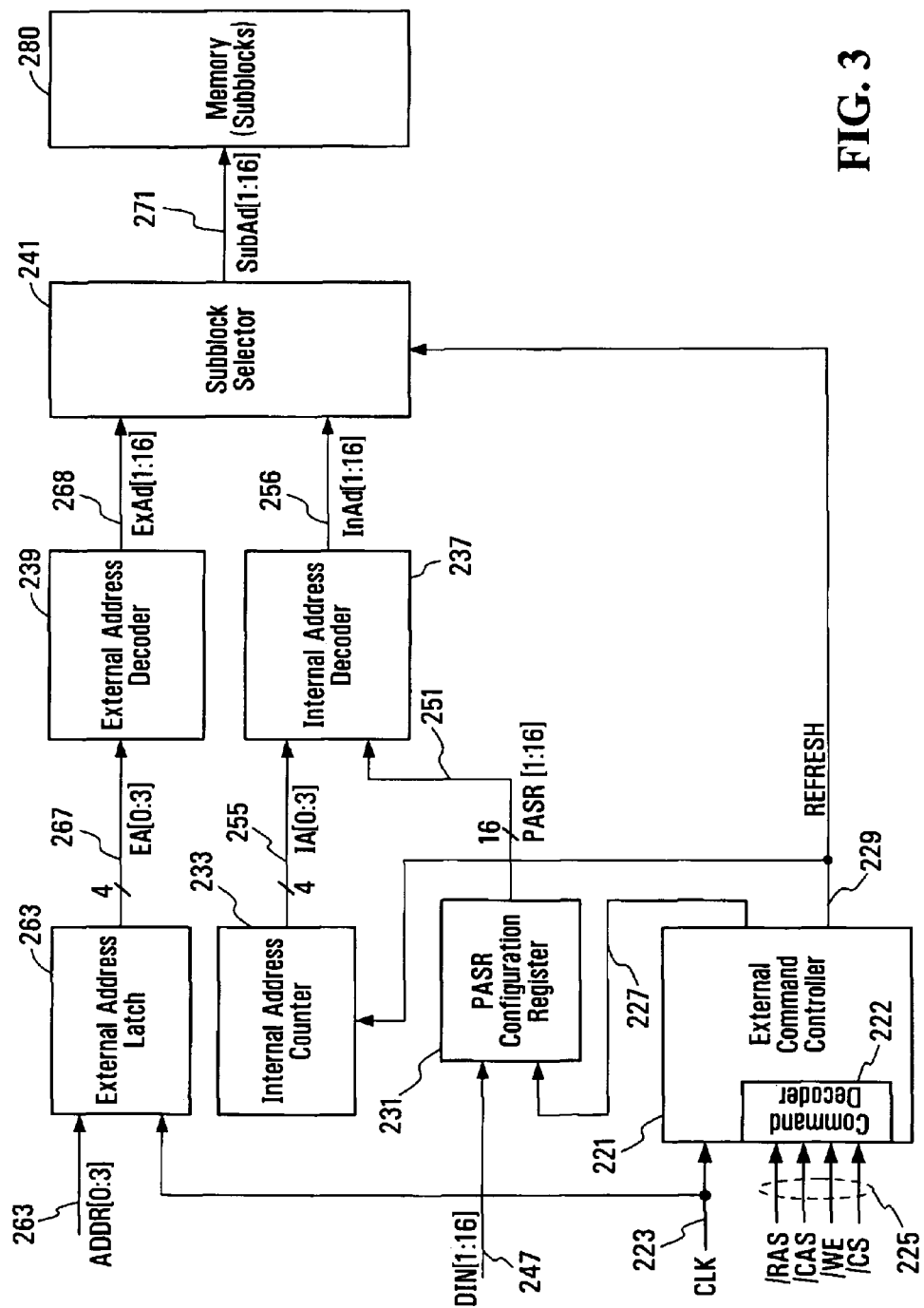
FIG. 3 is a schematic diagram illustrating a DRAM device according to an embodiment of the present invention.

FIG. 3 shows a DRAM device according to an embodiment of the present invention. The DRAM device includes a memory that has 16 memory subblocks. In the embodiment, for example, the address data in the form of subblock selection input SubAd[1:16] is provided from pins (not shown) of 16 bits that correspond to 16 different memory subblocks of a full memory block of a DRAM. Each data input pin is associated with a respective subblock of the memory.

Referring to FIG. 3, an external command controller 221 including a command decoder 222, which is synchronous with the clocks of a clock signal 223, receives a command signal 225 including commands "/RAS", "/CAS", "/WE", "/CS". The command decoder 222 interprets the commands and provides a configuration control clock signal 227 to a partial array self-refresh (PASR) configuration register 231 for writing the PASR configuration information thereinto. Also, the external command controller 221 provides a refresh request signal 229 to an internal address counter 233 and a subblock selector 241. The PASR configuration register 231 receives a data input signal 247 that contains subblock selection input data DIN[1:16]. The PASR configuration register 231 includes 16 flip-flops for latching the subblock selection input data DIN[1:16]) and provides a PASR signal 251 including PASR configuration register set commands. Each signal containing the PASR configuration register set command is an active "high" signal.

In some embodiments, the refresh request signal 229 is a self-refresh mode signal. The self-refresh mode signal is provided by the external command controller 221 upon an entry to and an exit from the self-refresh. In the self-refresh mode operation, an internally generated address (for rows or words) is output by the internal address counter 233.

The internal address counter 233 generates a four-bit internal address signal "IA[0:3]" 255 in response to the refresh request signal 229. The internal address signal 255 is provided to an internal address decoder 237. Each bit signal of the internal address signal 255 is a repetitive pulse signal having a respective predetermined repetition period and a predetermined pulse width. The internal address decoder 237 provides a decoded internal address signal 256 containing 16 decoded internal addresses InAd[1:16] to the subblock selector 241. A four-bit external address signal "ADDR[0:3]" 261 is provided to an external address latch 263 that latches the addresses ADDR[0:3], synchronizing with a clock signal "CLK" 265. The external address latch 263 provides four-bit external address signal "EA[0:3]" 267 to an external address decoder 239 which provides a decoded external address signal 268 containing 16 decoded external addresses "ExAd[1:16]" to the subblock selector 241.

In response to the refresh request signal 229, the subblock selector 241 selects the decoded external address signal 268 or the decoded internal address signal 256 and provides a subblock address signal 271 to a memory 280. The memory 280 includes 16 subblocks. The memory 280 has a plurality of wordlines, bitlines and data cells (not shown).

Figure 4:
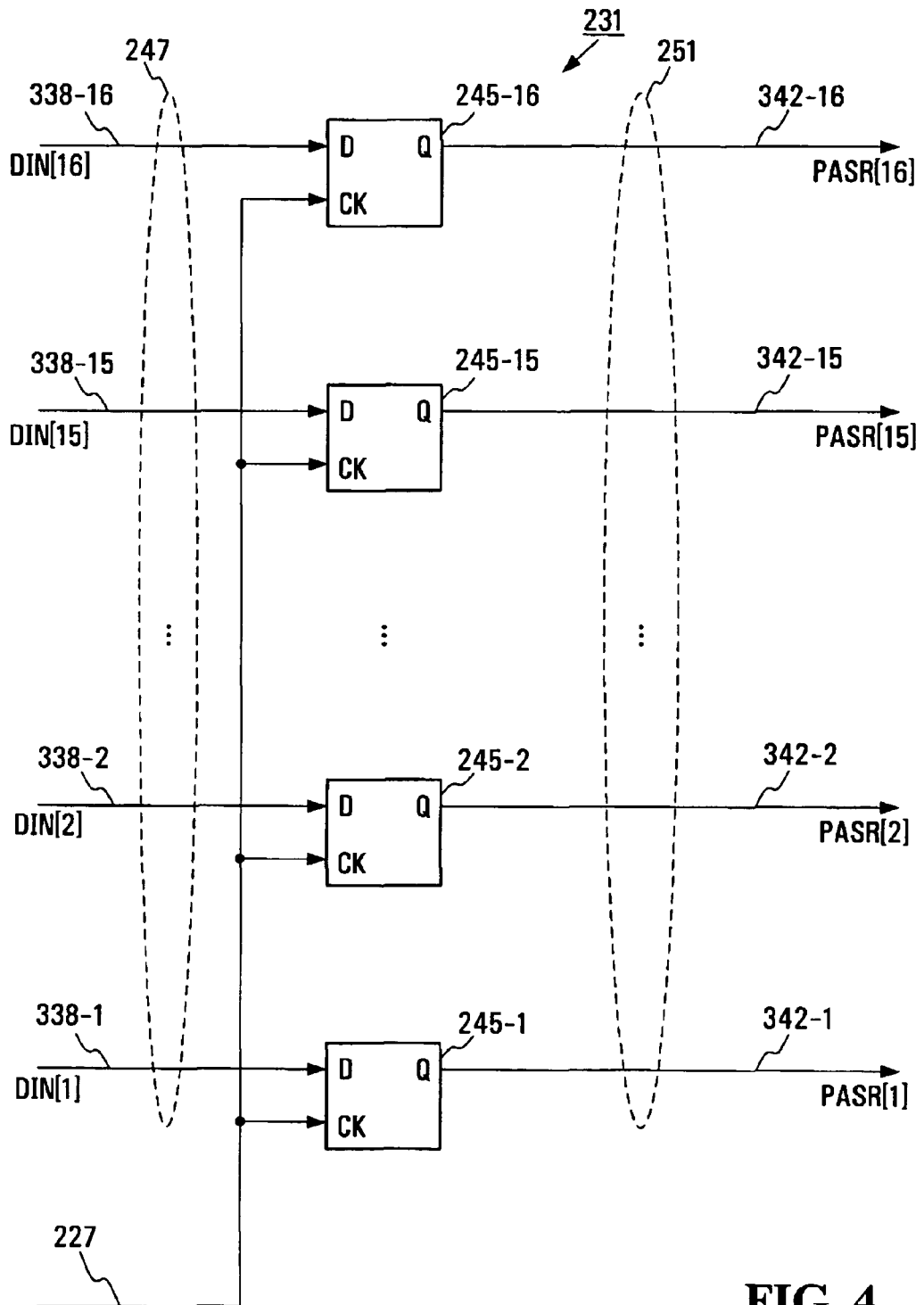
FIG. 4 is a schematic diagram illustrating a detailed circuit of a partial array self-refresh (PASR) configuration register shown in FIG. 3.

FIG. 4 shows a detailed circuit of the PASR configuration register 231 shown in FIG. 3. Referring to FIG. 4, the PASR configuration register 231 includes 16 D type flip-flops (D-FFs) 245-1-245-16, the D inputs of which receive respective data input signal 338-1-338-16 included in the data input signal 247. The configuration control clock signal 227 is commonly fed to the clock inputs CK of the D-FFs 245-1-245-16. The 16 D-FFs 245-1-245-16 provide 16 PASR bit signals 342-1-342-16 included in the PASR signal 251.

Following Table 2 shows the relation between the subblock selection input data DIN[1]-DIN[16] and the partial array self-refresh (PASR) settings.

TABLE 2

| Subblock Selection Input Data DIN | Partial Array Self-Refresh PASR |
|---|---|
| DIN[1] | PASR[1] |
| DIN[2] | PASR[2] |
| DIN[3] | PASR[3] |
| DIN[4] | PASR[4] |
| DIN[5] | PASR[5] |
| DIN[6] | PASR[6] |
| DIN[7] | PASR[7] |
| DIN[8] | PASR[8] |
| DIN[9] | PASR[9] |
| DIN[10] | PASR[10] |
| DIN[11] | PASR[11] |
| DIN[12] | PASR[12] |
| DIN[13] | PASR[13] |
| DIN[14] | PASR[14] |
| DIN[15] | PASR[15] |
| DIN[16] | PASR[16] |

Figure 5:
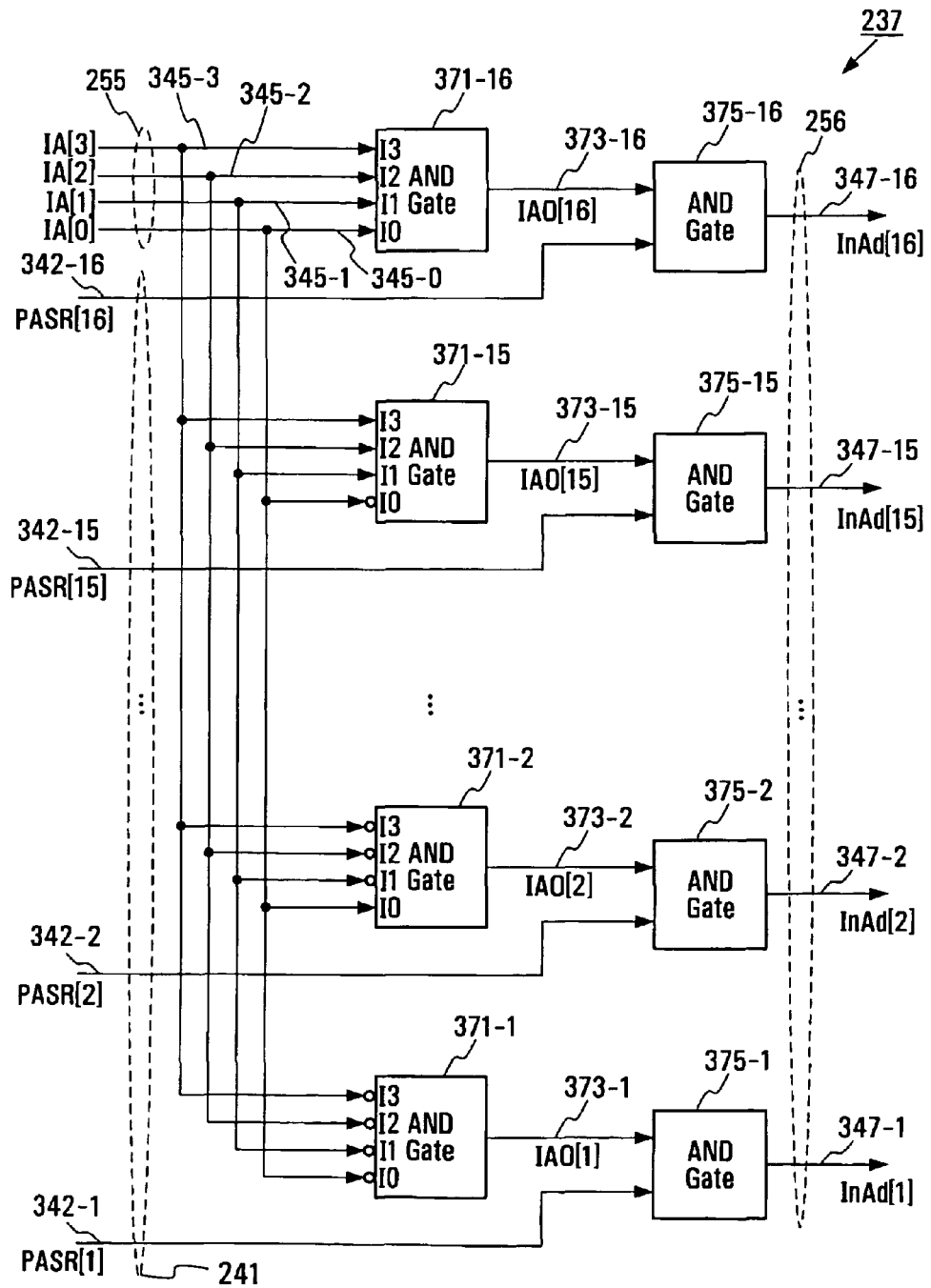
FIG. 5 is a schematic diagram illustrating a detailed circuit of an external address decoder shown in FIG. 3.

FIG. 5 shows a detailed circuit of the internal address decoder 237 shown in FIG. 3. Referring to FIG. 5, the internal address signal 255 contains four internal addresses IA[0], IA[1], IA[2] and IA[3] represented by four internal address bit signals 345-0, 345-1, 345-2 and 345-3 that are fed to 16 AND gates 371-1-371-16, each having four inputs I0, I1, I2 and I3. The AND gates 371-1-371-16 provide 16 internal output bit signals 373-1-373-16 that are fed to 16 AND gates 375-1-375-16. Also, the PASR signal 251 includes 16 PASR bit signals 342-1-342-16 that are fed to the 16 AND gates 375-1-375-16. The 16 AND gates 375-1-375-16 provides 16 decoded internal address bit signals 347-1-347-16 included in the decoded internal address signal 256.

Following Table 3 shows the relation between the internal address bits IA[0:3] and the internal address output IAO[1:16] to be logic "high". In the following table, "0" and "1" represent logic "low" and "high", respectively.

TABLE 3

| IA3 | IA2 | IA1 | IA0 | IAO to be "High" |
|---|---|---|---|---|
| 0 | 0 | 0 | 0 | IAO[1] |
| 0 | 0 | 0 | 1 | IAO[2] |
| 0 | 0 | 1 | 0 | IAO[3] |
| 0 | 0 | 1 | 1 | IAO[4] |
| 0 | 1 | 0 | 0 | IAO[5] |
| 0 | 1 | 0 | 1 | IAO[6] |
| 0 | 1 | 1 | 0 | IAO[7] |
| 0 | 1 | 1 | 1 | IAO[8] |
| 1 | 0 | 0 | 0 | IAO[9] |
| 1 | 0 | 0 | 1 | IAO[10] |
| 1 | 0 | 1 | 0 | IAO[11] |
| 1 | 0 | 1 | 1 | IAO[12] |
| 1 | 1 | 0 | 0 | IAO[13] |
| 1 | 1 | 0 | 1 | IAO[14] |
| 1 | 1 | 1 | 0 | IAO[15] |
| 1 | 1 | 1 | 1 | IAO[16] |

In order to perform the logic operation as shown in above Table 3, the AND gates 371-1-371-16 have predetermined inverting inputs. For example, the AND gate 371-1 has four inverting inputs I0, I1, I2 and I3. The AND gate 371-2 has three inverting inputs I1, I2 and I3. Similarly, the AND gate 371-15 has one inverting inputs I0. The AND gate 371-16 has no inverting inputs.

Following Table 4 shows the relation between PASR to be logic "high", IAO to be logic "high" and the subblock to be designated or selected in the memory 280.

TABLE 4

| PASR to be "High" | IAO to be "High" | Subblock to be Selected |
|---|---|---|
| PASR[16] | IAO[16] | Subblock[16] |
| PASR[15] | IAO[15] | Subblock[15] |
| PASR[14] | IAO[14] | Subblock[14] |
| PASR[13] | IAO[13] | Subblock[13] |
| PASR[12] | IAO[12] | Subblock[12] |
| PASR[11] | IAO[11] | Subblock[11] |
| PASR[10] | IAO[10] | Subblock[10] |
| PASR[9] | IAO[9] | Subblock[9] |
| PASR[8] | IAO[8] | Subblock[8] |
| PASR[7] | IAO[7] | Subblock[7] |
| PASR[6] | IAO[6] | Subblock[6] |
| PASR[5] | IAO[5] | Subblock[5] |
| PASR[4] | IAO[4] | Subblock[4] |
| PASR[3] | IAO[3] | Subblock[3] |
| PASR[2] | IAO[2] | Subblock[2] |
| PASR[1] | IAO[1] | Subblock[1] |

Figure 6:
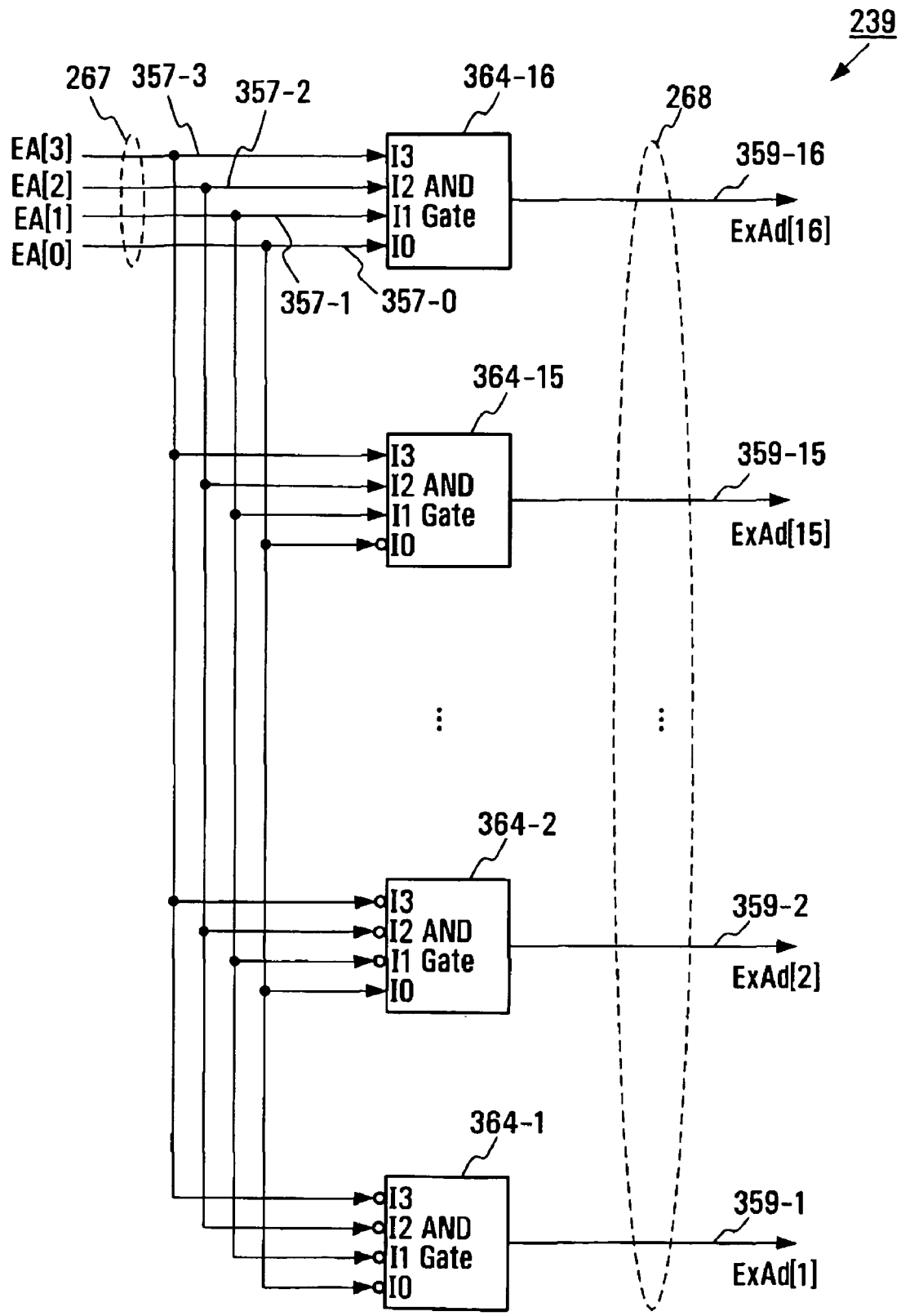
FIG. 6 is a schematic diagram illustrating a detailed circuit of an internal address decoder shown in FIG. 3.

FIG. 6 shows a detailed circuit of the external address decoder 239 shown in FIG. 3. Referring to FIG. 6, the external address signal 267 contains four external addresses EA[0], EA[1], EA[2] and EA[3] represented by four external address bit signals 357-0, 357-1, 357-2 and 357-3 that are fed to 16 AND gates 364-1-364-16. The AND gates 364-1-364-16 provide 16 decoded external address bit signals 359-1-359-16 included in the decoded external address signal 268. Following Table 5 shows the relation between the internal address IA bits and the subblock to be designated or selected in the memory 280. In the following table, "0" and "1" represent logic "low" and "high", respectively.

TABLE 5

| EA[3] | EA[2] | EA[1] | EA[0] | Subblock |
|---|---|---|---|---|
| 0 | 0 | 0 | 0 | [1] |
| 0 | 0 | 0 | 1 | [2] |
| 0 | 0 | 1 | 0 | [3] |
| 0 | 0 | 1 | 1 | [4] |
| 0 | 1 | 0 | 0 | [5] |
| 0 | 1 | 0 | 1 | [6] |
| 0 | 1 | 1 | 0 | [7] |
| 0 | 1 | 1 | 1 | [8] |
| 1 | 0 | 0 | 0 | [9] |
| 1 | 0 | 0 | 1 | [10] |
| 1 | 0 | 1 | 0 | [11] |
| 1 | 0 | 1 | 1 | [12] |
| 1 | 1 | 0 | 0 | [13] |
| 1 | 1 | 0 | 1 | [14] |
| 1 | 1 | 1 | 0 | [15] |
| 1 | 1 | 1 | 1 | [16] |

In order to perform the logic operation as shown in above Table 5, the AND gates 364-16, 364-15, - - - and 364-1 have predetermined inverting inputs which are identical to the inverting inputs of the AND gates 371-16, 371-15, - - - and 371-1 shown in FIG. 5.

Figure 7:
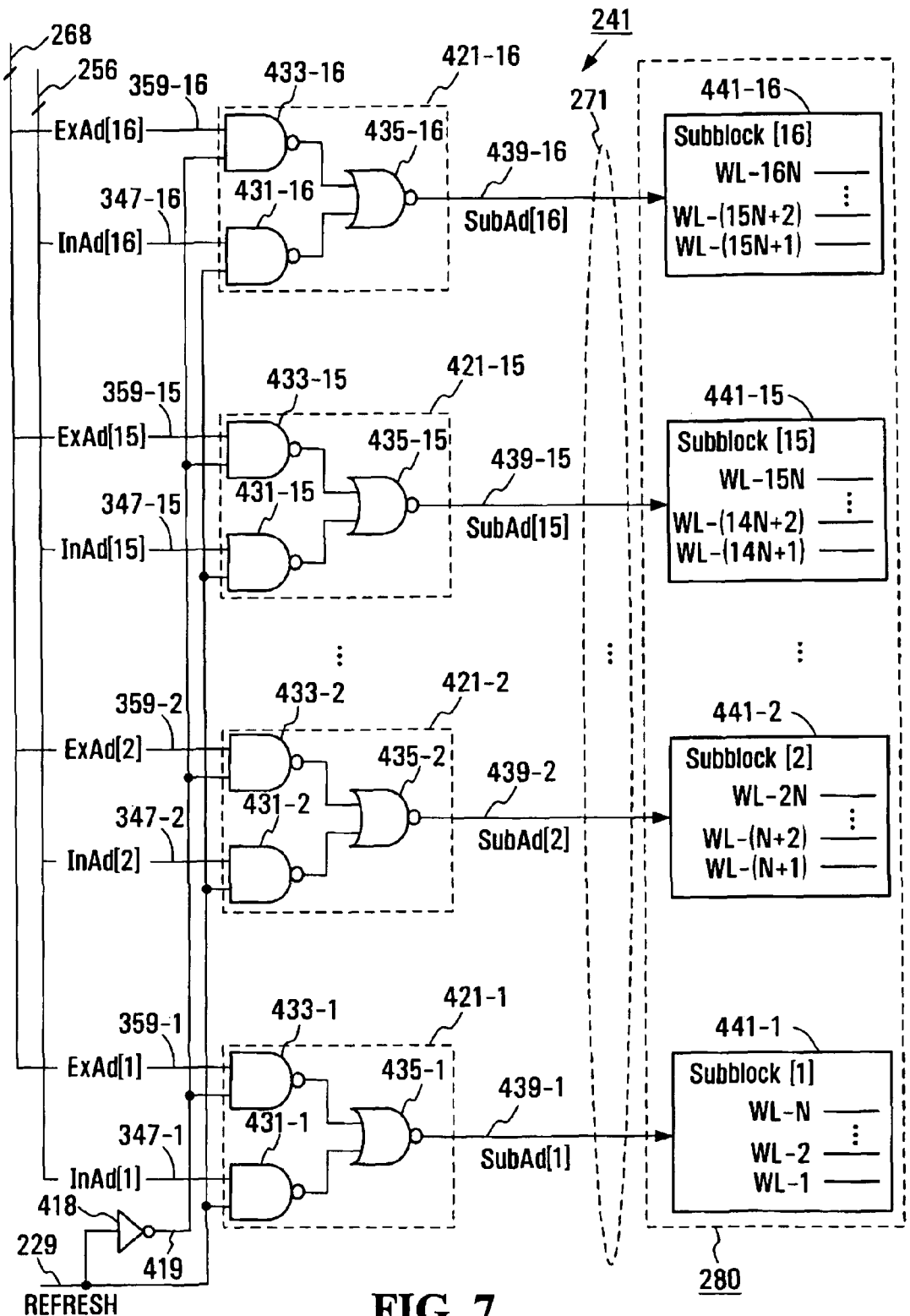
FIG. 7 is a schematic diagram illustrating a detailed circuit of subblock selectors and a memory shown in FIG. 3.

FIG. 7 shows detailed circuits of the subblock selector 241 and the memory 280 shown in FIG. 3. Referring to FIG. 7, the decoded external address bit signals 359-1-359-16 included in the decoded external address signal 268 and the decoded internal address bit signals 347-1-347-16 included in the decoded internal address signal 256 are fed to 16 selection logic circuits 421-1-421-16 included in the subblock selector 241. The 16 selection logic circuits 421-1-421-16 are the same circuit structure and each of them has two NAND gates and one NOR gate.

The refresh request signal 229 and its inverted signal 419 by an inverter 418 are fed to the 16 selection logic circuits 421-1- and 421-16. In the selection logic circuit 421-16, a NAND gate 431-16 receives the decoded internal address bit signal 347-16 and the refresh request signal 229 and a NAND gate 433-16 receives the decoded external address bit signal 359-16 and the inverted signal 419. Two logic output signals from the NAND gates 431-16 and 433-16 are fed to a NOR gate 435-16 which in turn provides a subblock bit signal 439-16. Similarly, the selection logic circuit 421-15 includes a NAND gate 431-15 that receives the decoded internal address bit signal 347-15 and the refresh request signal 229 and a NAND gate 433-15 receives the decoded external address bit signal 359-15 and the inverted signal 419. Two logic output signals from the NAND gates 431-15 and 433-15 are fed to a NOR gate 435-15 which in turn provides a subblock bit signal 439-15.

The selection logic circuit 421-2 includes two NAND gates 431-2 and 433-2. The NAND gate 431-2 receives the decoded internal address bit signal 347-2 and the refresh request signal 229. The NAND gate 433-2 receives the decoded external address bit signal 359-2 and the inverted signal 419. Two logic output signals from the NAND gates 431-2 and 433-2 are fed to a NOR gate 435-2 which in turn provides a subblock bit signal 439-2. In the selection logic circuit 421-1, a NAND gate 431-1 receives the decoded internal address bit signal 347-1 and the refresh request signal 229. A NAND gate 433-1 receives the decoded external address bit signal 359-1 and the inverted signal 419. Two logic output signals from the NAND gates 431-1 and 433-1 are fed to a NOR gate 435-1 which in turn provides a subblock bit signal 439-1. The 16 subblock bit signals 439-1-439-16 are included in the subblock address signal 271.

The memory 280 includes 16 subblocks 441-1-441-16 that receive the subblock bit signals 439-1- and 439-16, respectively. The memory 280 has a plurality of wordlines, bitlines and data cells (not shown). The subblock 441-1 has wordlines WL-1-WL-N. The subblock 441-2 has wordlines WL-(N+1)-WL-2N. The subblock 441-15 has wordlines WL-(14N+1)-WL-15N. The subblock 441-16 has wordlines WL-(15N+1)-WL-16N.

Figure 8:
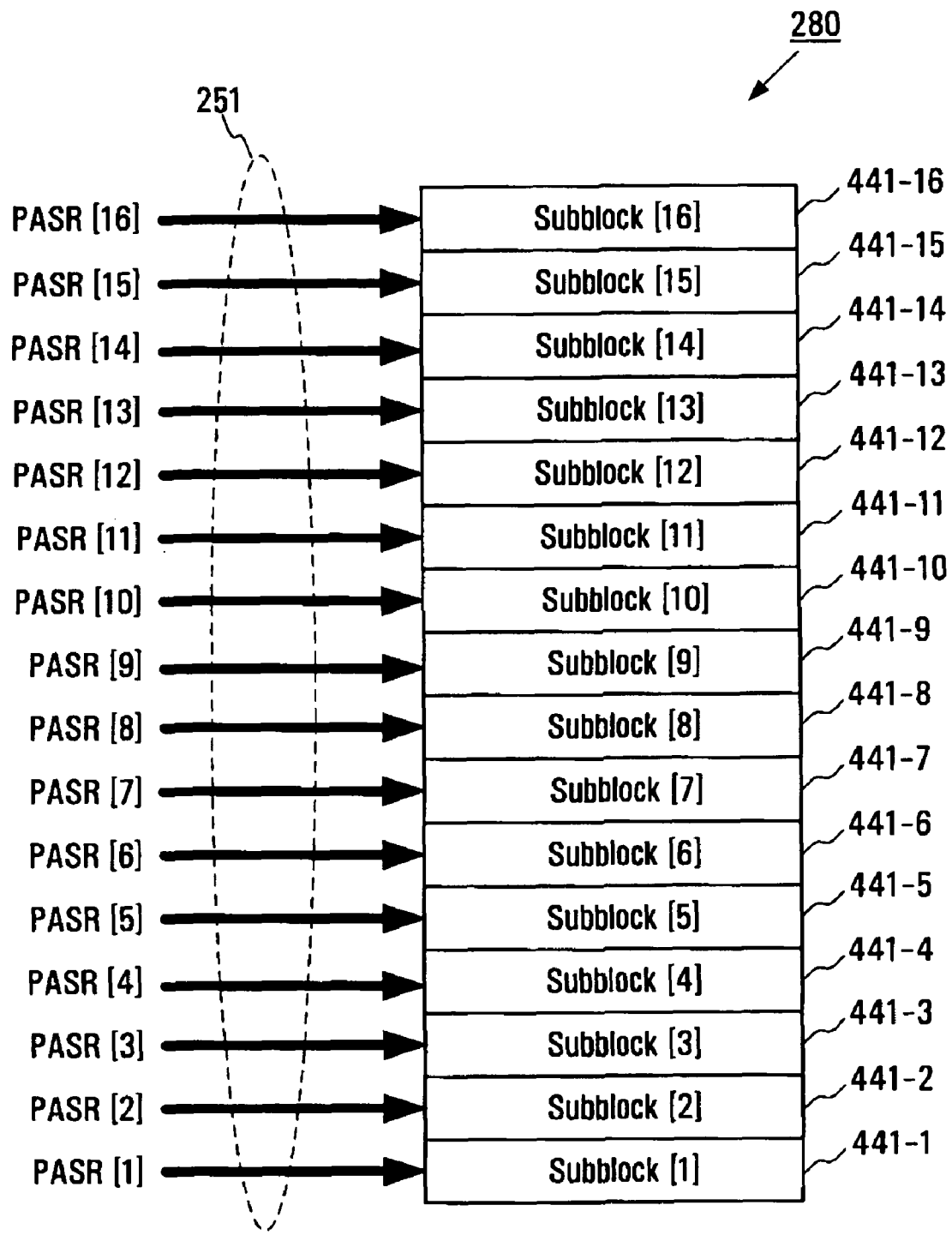
FIG. 8 is a schematic diagram illustrating an example of the addressing of the subblocks of the memory shown in FIG. 3.

FIG. 8 shows an example of the addressing in the DRAM device shown in FIG. 3. Referring to FIG. 8, the PASR signal 251 contains the PASR[1]-PASR[16] to address the 16 subblocks 441-1-441-16 of the memory 280.

Referring to FIGS. 3-8, the PASR configuration register 231 generates 16 different signal bits which are called here the PASR signal "PASR[1:16]" 251. The 16-bit signals enable or disable any one of the 16 memory subblocks including the subblocks 441-1-441-16 through the selection logic circuit 421-1-421-16. If, for example, PASR[1] is set logically "high", the subblock[1] 441-1 of the memory 280 is to be refreshed. If PASR[1] is set logically "low", the subblock [1] 441-1 is to be non-refreshed, so that data may be lost therein.

Figure 9:
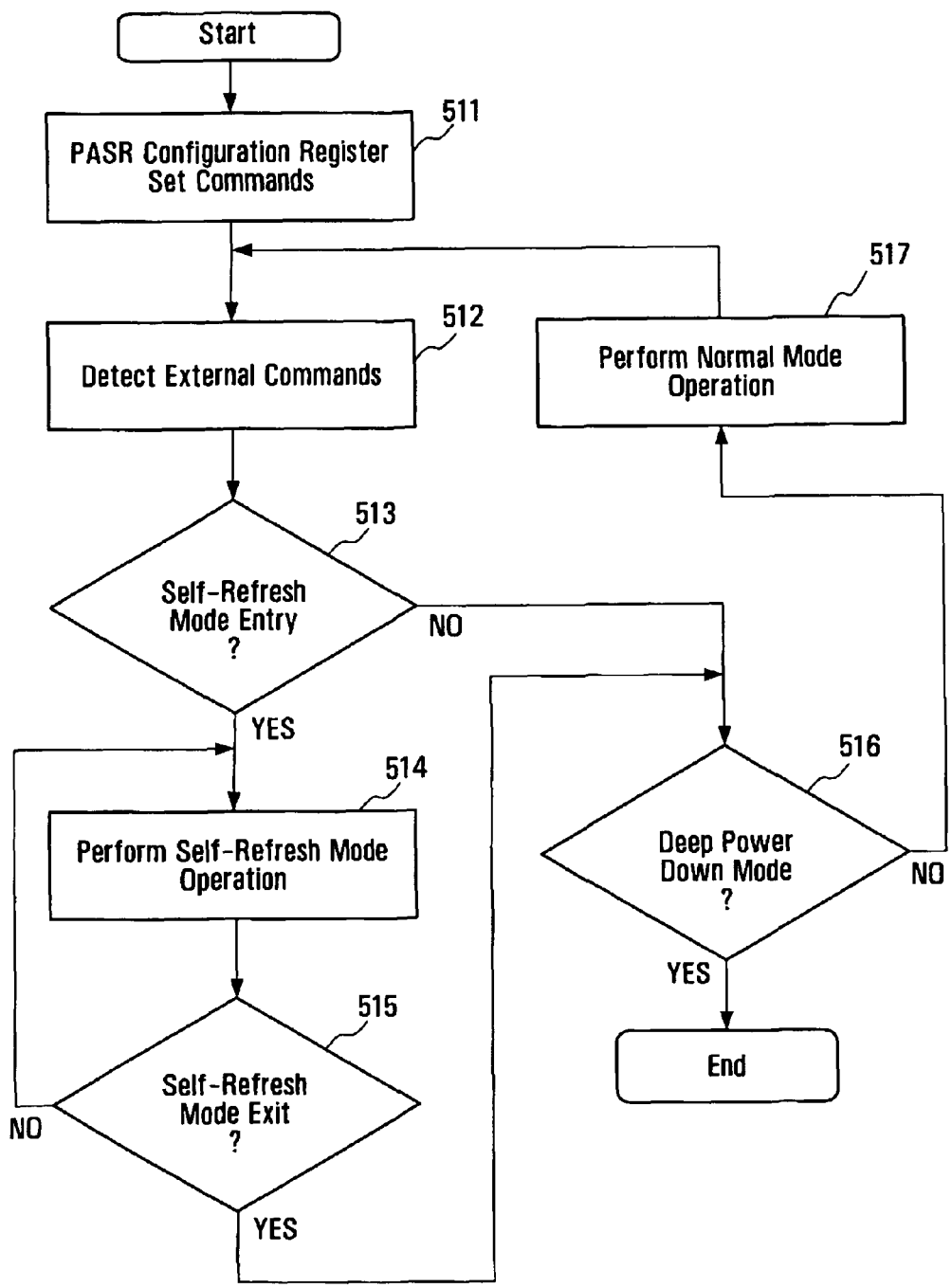
FIG. 9 is a flowchart illustrating the operation of the DRAM device shown in FIG. 3.

FIG. 9 shows the operation of the DRAM device shown in FIG. 3. Referring to FIGS. 3-9, in the operation mode, the memory controller (not shown) provides the subblock selection input data DIN[1:16] as the data input signal 247 to the DRAM device (i.e., the PASR configuration register 231).

The subblock selection input data DIN[1:16] is provided and the PASR configuration register set commands are latched in the D-FFs 245-1-245-16 (step 511). The command decoder 222 of the external command controller 221 decodes the commands of the command signal 225 (step 512). In a case where a self-refresh entry command is detected (YES at step 513), the self-refresh operation is performed (step 514). Until a self-refresh exit command is detected by the external command controller 221 (YES at step 515), the self-refresh operation is performed (step 514). In a case where a self-refresh entry command is not detected (NO at step 513) or a self-refresh exit is detected (YES at step 515), it is determined whether the DRAM device is in a deep power down mode (step 516). If no deep power down command is detected by the command decoder 222 (NO at step 516), the normal operation is performed (step 517). Thereafter, the above operations at steps 512-516 are repeated. If the DRAM device is, however, in a deep power down mode (YES at step 516), that is, a deep power down command is detected by the command decoder 222, the operation of the DRAM device will be disabled.

Figure 10:
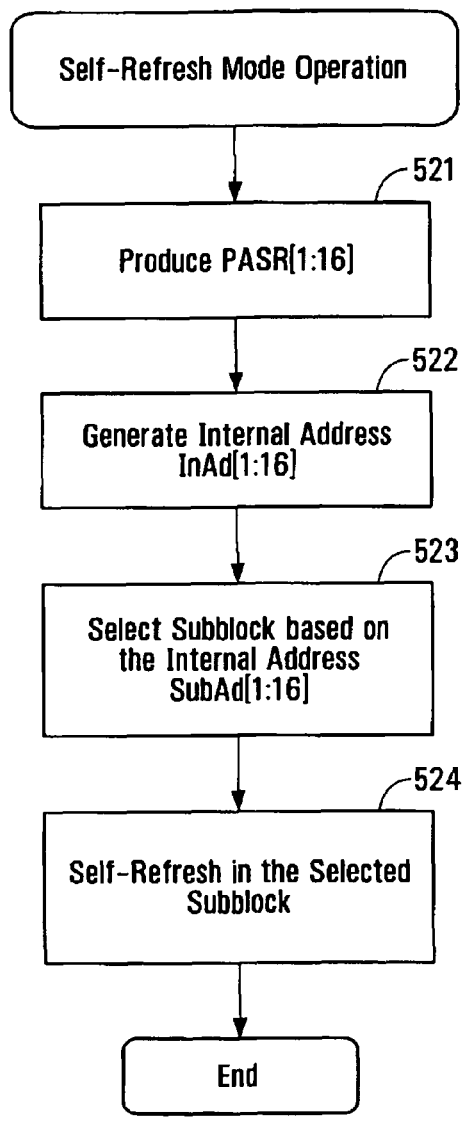
FIG. 10 is a flowchart illustrating the self-refresh operation of the DRAM device shown in FIG. 3.

FIG. 10 shows the self-refresh operation of the DRAM device at step 514 shown in FIG. 9. Referring to FIGS. 2-10, the subblock selection input data DIN[1:16] are already latched in the 16 D-FFs 245-1-245-16 of the PASR configuration register 231 (step 511) and the PASR configuration register 231 produces the PASR signal 251 (step 521). The internal address counter 233 generates the internal address signal "IA[0:3]" 255 and the internal address decoder 237 produces the decoded internal address signal "InAd[1:16]" 256 (step 522). In response to the refresh request signal 229, the subblock address signal 271 containing the subblock addresses SubAd[1:16] is produced and the subblock selector 241 selects the subblocks 441-1-441-16 of the memory 280 (step 523). In the selected subblock(s) from the subblocks 441-1-441-16, with the self-refresh operation, known address controlling operation is performed to select the wordlines WLs to which the DRAM cells are connected are refreshed (step 524).

vided to the subblock selector 241 (step 533). The subblock selector 241 selects the decoded external addresses ExAd[1:16] of the decoded external address signal 268 are selected and the subblock selector 241 selects the subblocks 441-1-441-16 of the memory 280 (step 534). Then, the normal memory access operation is performed (step 535).

For example, when PASR[16] is set logically "high", which means that the subblock[16] is to be refreshed. In response to the PASR bit signal 342-16 ("high"), the AND gate 375-16 passes the internal output bit signal 373-16 "IAO[16]" as the decoded internal address bit signal 347-16 ("InAd[16]"). With the "high" logic state of the refresh request signal 229, the decoded internal address bit signal 347-16 is inverted by the NAND gate 431-16 and re-inverted by the NOR gate 435-16 of the selection logic circuit 421-16. Thus, the internal address InAd[16] of the decoded internal address bit signal 347-16 is provided as the subblock bit signal 439-16. The "high" state of the decoded internal address InAd[16] allows the subblock 441-16 to be refreshed during the self-refresh period. If the refresh request signal 229 is logic "low", the NAND gates 431-16-431-1 of the selection logic circuits 421-16-421-1 do not pass the internal addresses InAd[16:1] of the decoded internal address bit signals 347-16-347-1 and the external addresses ExAd[16:1] of the decoded external address bit signal 359-16-359-1 are forwarded by the subblocks 441-16-441-1 to the memory 280.

In accordance with settings of the PASR configuration register 231, the partial array refresh is varied. Following Table 6 shows the settings (logic states) of the PASR configuration register 231 for refreshing subblock[1] to subblock[6] in the self-refresh mode. In the following tables, "L" and "H" represent logic "low" and "high", respectively.

TABLE 6

| PASR | [16] | [15] | [14] | [13[ | [12] | [11] | [10] | [9] | [8] | [7] | [6] | [5] | [4] | [3] | [2] | [1] |
|---|---|---|---|---|---|---|---|---|---|---|---|---|---|---|---|---|
| Logic State | L | L | L | L | L | L | L | L | L | L | H | H | H | H | H | H |

In accordance with the above settings, the sequence of the self-refresh is subblock[6] subblock[5]→subblock[4]→subblock[3]→subblock[2]→subblock[1]. The sequence operation is performed in response to the repetitive pulses of the address signal.

Following Table 7 shows the settings of the PASR configuration register 231 for refreshing subblock[1], subblock[8] and subblock[16] in the self-refresh mode.

TABLE 7

| PASR | [16] | [15] | [14] | [13[ | [12] | [11] | [10] | [9] | [8] | [7] | [6] | [5] | [4] | [3] | [2] | [1] |
|---|---|---|---|---|---|---|---|---|---|---|---|---|---|---|---|---|
| Logic State | H | L | L | L | L | L | L | L | H | L | L | L | L | L | L | H |

Figure 11:
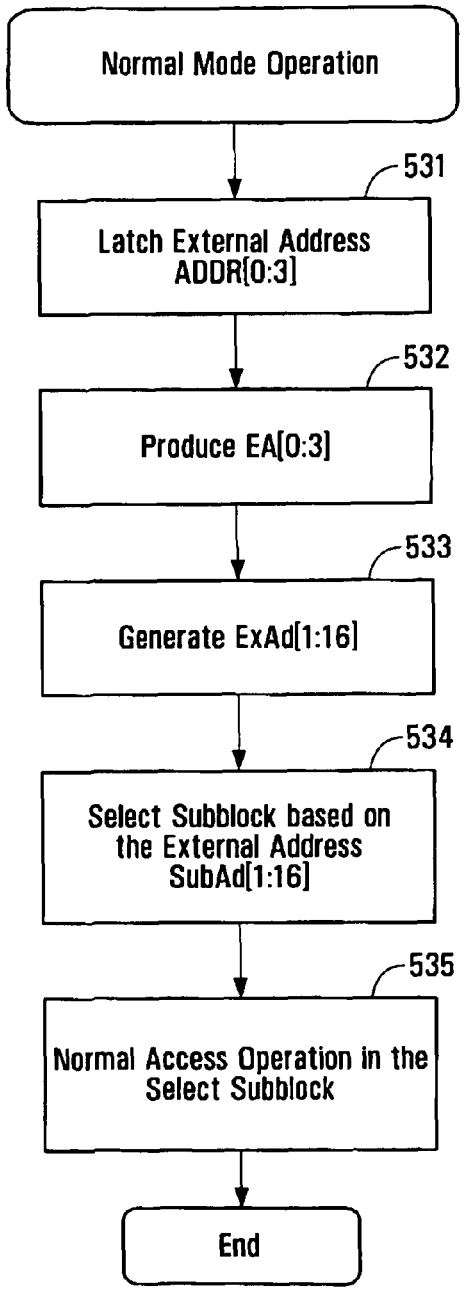
FIG. 11 is a flowchart illustrating the normal operation of the DRAM device shown in FIG. 3.

FIG. 11 shows the normal operation of the DRAM device at step 517 shown in FIG. 9. Referring to FIGS. 2-11, the external address latch 263 latches ADDR[0:3] of the external address signal 261 (step 531) and provides EA[0:3] of the external address signal 267. The external address decoder 239 decodes EA[0:3] (step 532) and the decoded addresses ExAd[1:16] of the decoded external address signal 268 are pro- In accordance with the above settings, the sequence of the self-refresh is subblock[16]→subblock[8]→subblock[1].

Following Table 8 shows the settings of the PASR configuration register 231 for refreshing subblock[1] to subblock[16] in the self-refresh mode.

TABLE 8

| PASR | [16] | [15] | [14] | [13[ | [12] | [11] | [10] | [9] | [8] | [7] | [6] | [5] | [4] | [3] | [2] | [1] |
|---|---|---|---|---|---|---|---|---|---|---|---|---|---|---|---|---|
| Logic State | H | H | H | H | H | H | H | H | H | H | H | H | H | H | H | H |

In accordance with the above settings, the sequence of the self-refresh is subblock[16]→subblock[15]→subblock[14]→ subblock[13]→subblock[12]→subblock[11]→subblock[10]→subblock[9]→subblock[8]→subblock[7]→subblock[6]→subblock[5]→subblock[4]→subblock[3]→subblock[2]→subblock[1].

Following Table 9 shows the settings of the PASR configuration register 231 for not refreshing any subblocks in the self-refresh mode.

TABLE 9

| PASR | [16] | [15] | [14] | [13[ | [12] | [11] | [10] | [9] | [8] | [7] | [6] | [5] | [4] | [3] | [2] | [1] |
|---|---|---|---|---|---|---|---|---|---|---|---|---|---|---|---|---|
| Logic State | L | L | L | L | L | L | L | L | L | L | L | L | L | L | L | L |

In summary, for the particular implementation described, while in the self-refresh mode, the memory's subblock that is refreshed is selected by the logical combination of the PASR configuration register 231 and the decoded address from the internal address counter 233.

In accordance with the subblock selection input data DIN [1:M] represented by the data input signal 201, separate PASR settings (PASR[1:16]) are provided for the respective ones of the subblock 441-1-441-16, with the results that the fully independent controllability of multiple memory subblocks' partial refresh is performed. As such, the same number of dedicated partial array refresh signals as that of memory sub-arrays is very efficient way to provide the maximum controllability of power saving in a standby or sleep mode as well as maximum flexibility of memory usage in performance point of view.

Figure 12:
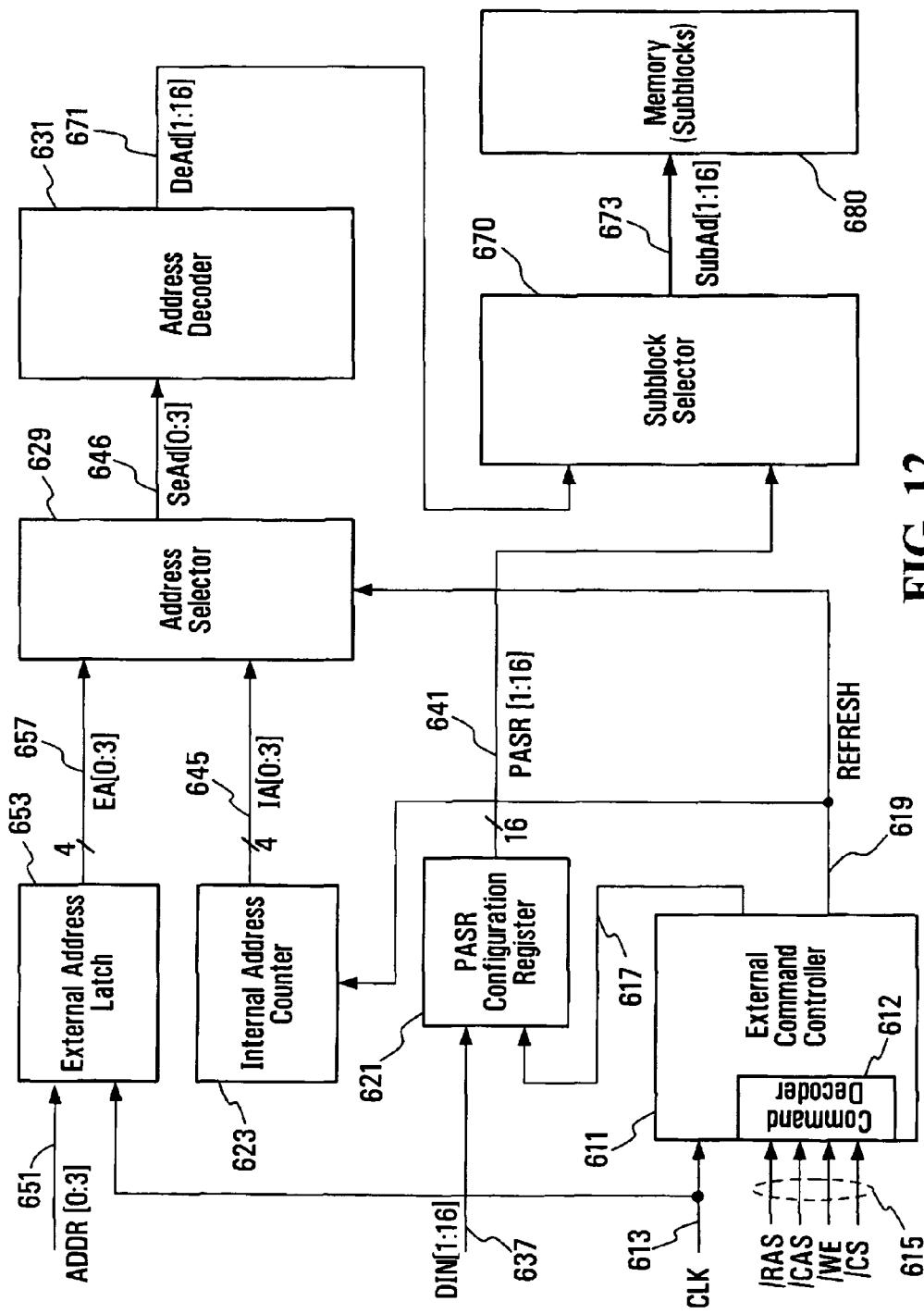
FIG. 12 is a schematic diagram illustrating a DRAM device according to another embodiment of the present invention.

FIG. 12 shows a DRAM device according to another embodiment of the present invention. The DRAM device includes a memory that has 16 memory subblocks. In the embodiment, for example, the data is provided from pins of 16 bits that correspond to 16 different memory subblocks of a full memory block of a DRAM. Each data input pin is associated with a respective subblock of the memory.

Referring to FIG. 12, an external command controller 611 including a command decoder 612, which is synchronous with the clocks of a clock signal 613, receives a command signal 615 including commands "/RAS", "/CAS", "/WE", "/CS". The command decoder 612 interprets the commands and provides a configuration control clock signal 617 to a PASR configuration register 621 for writing configuration registration information thereinto. Also, the external command controller 611 provides a refresh request signal 619 to an internal address counter 623 and an address selector 629. The PASR configuration register 621 receives a data input signal 637 containing the subblock selection input data DIN [1:16]. The PASR configuration register 621 includes 16 flip-flops for latching the subblock selection input data DIN[1:16]) and provides a PASR signal 641 including PASR configuration register set commands "PASR[1:16]". The internal address counter 623 generates a four-bit internal address signal 645 "IA[0:3]" to the address selector 629. Each bit signal of the internal address signal 645 is a repetitive pulse signal having predetermined repetition period and a predetermined pulse width. A four-bit external address signal "ADDR[0:3]" 651 is provided to an external address latch 653 that latches ADDR[0:3] synchronizing with the clocks of a clock signal 655 "CLK". The external address latch 653 provides four-bit external address signal "EA[0:3]" 657 to the address selector 629.

In response to the refresh request signal 619, the address selector 629 selects the internal address signal 645 or the external address signal 657 and provides a selected address signal "SeAd[0:3]" 646 to an address decoder 631. The address decoder 631 provides a 16-bit decoded address signal "DeAd[1:16]" 671 to subblock selector 670 that receives the PASR signal 641. The subblock selector 670 provides a subblock address signal "SubAd[1:16]" 673 to a memory 680 including 16 subblocks. The memory 680 has a plurality of wordlines, bitlines and data cells. The external command controller 611, the internal address counter 623 and the external address latch 653 correspond to the external command controller 221, the internal address counter 233 and the external address latch 263 shown in FIG. 3, respectively.

Figure 13:
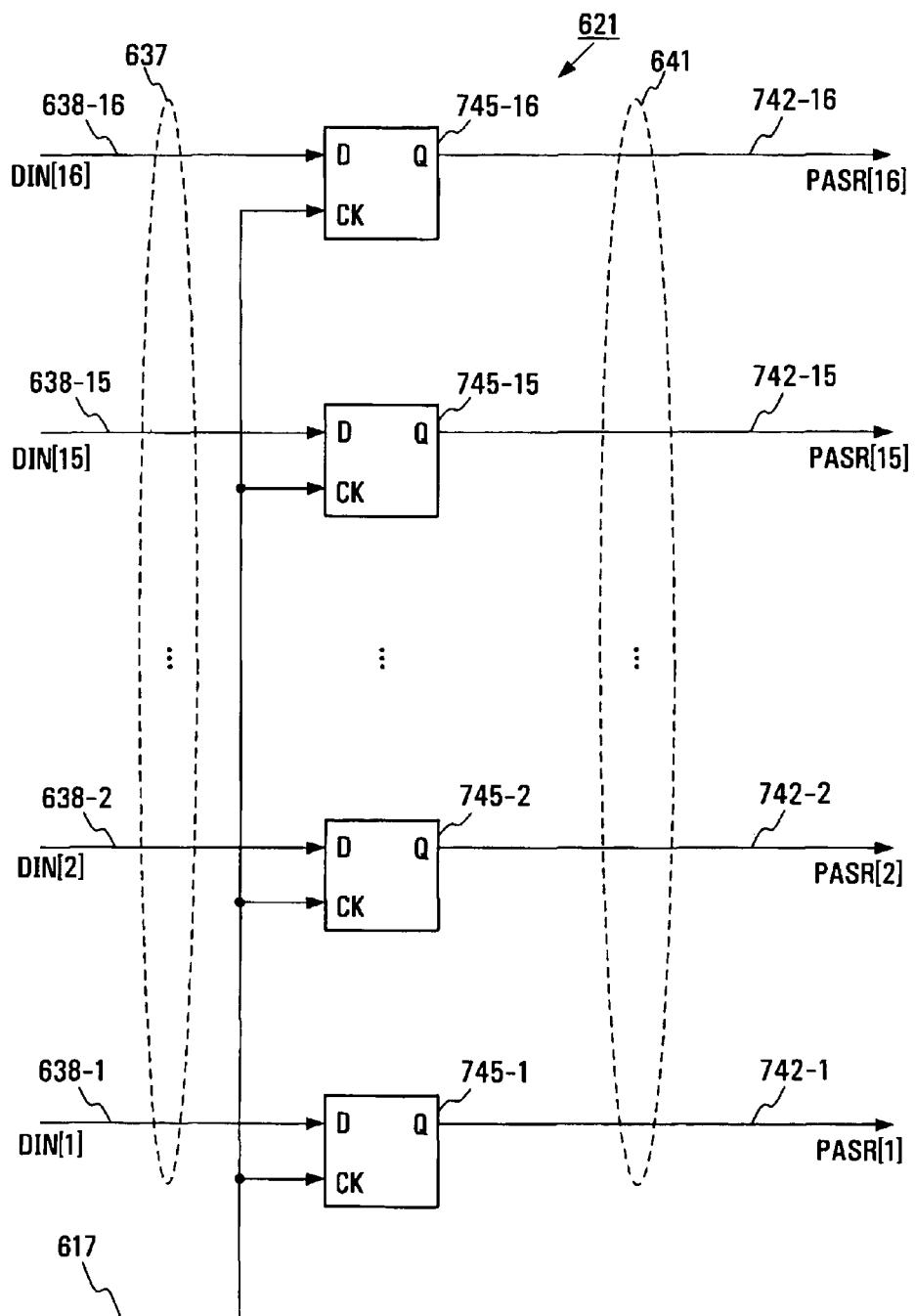
FIG. 13 is a schematic diagram illustrating a detailed circuit of a PASR configuration register shown in FIG. 12.

FIG. 13 shows a detailed circuit of the PASR configuration register 621 shown in FIG. 12. Referring to FIG. 13, the PASR configuration register 621 includes 16 D-FFs 745-1-745-16, the D inputs of which receive respective data input signal 638-1-638-16 (containing the subblock selection input data DIN[1:16]) included in the data input signal 637. The configuration control clock signal 617 is commonly fed to the clock inputs CK of the D-FFs 745-1-745-16. The 16 D-FFs 745-1-745-16 provide 16 PASR bit signals 742-1-742-16 included in the PASR signal 641.

Figure 14:
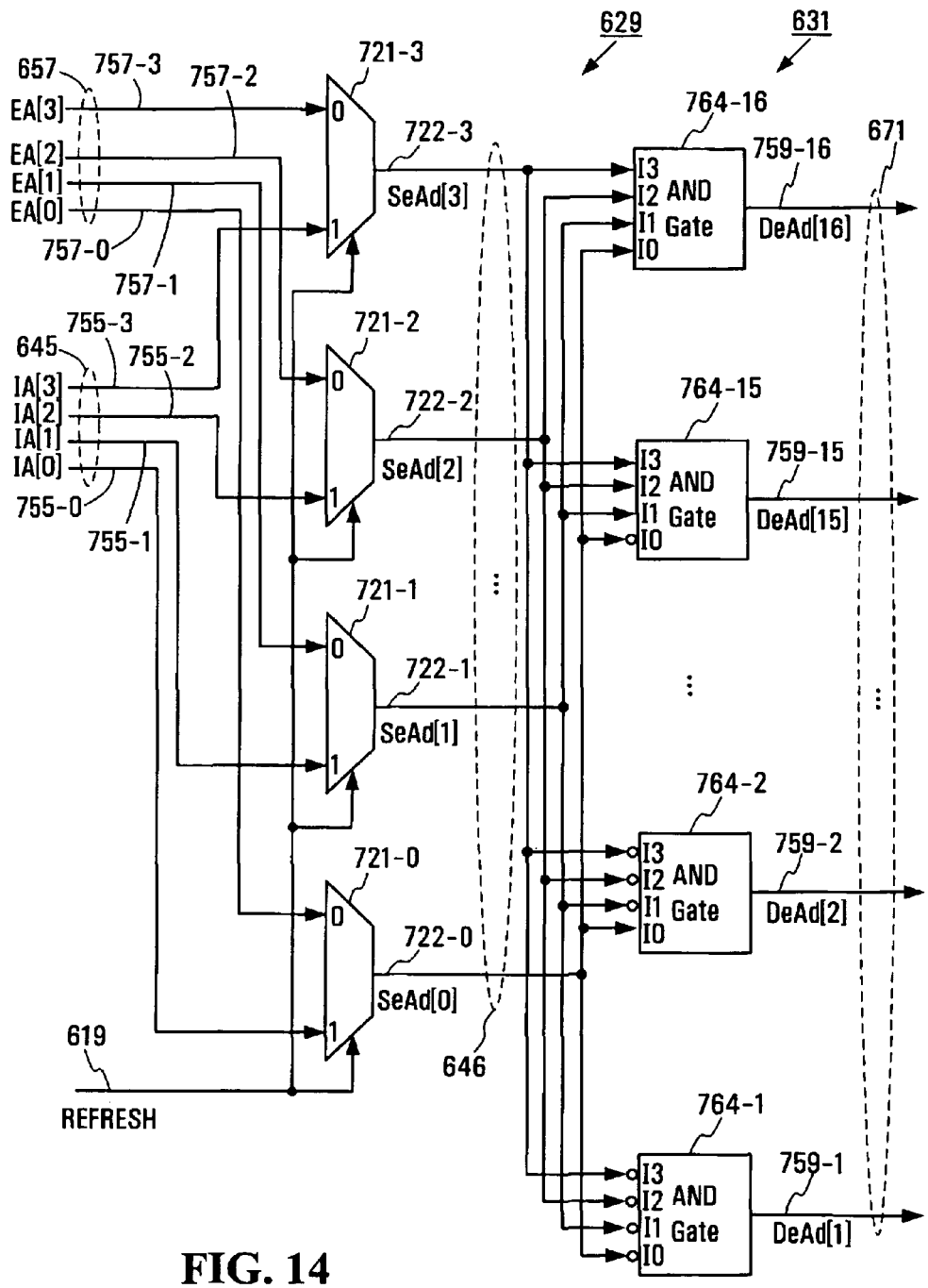
FIG. 14 is a schematic diagram illustrating a detailed circuit of a selector and an address decoder shown in FIG. 12.

FIG. 14 shows a detailed circuit of the address selector 629 and the address decoder 631 shown in FIG. 12. Referring to FIG. 14, the address selector 629 includes four multiplexers 721-0-721-3. The external address signal 657 includes four external address bit signals 757-0-757-3 representing EA[0:3] and the internal address signal 645 includes 4 internal address bit signals 745-0-745-3 representing IA[0:3]. The external address bit signals 757-0, 757-1, 757-2 and 757-3 and the internal address bit signals 755-0, 755-1, 755-2 and 755-3 are fed to the multiplexers 721-0-721-3, respectively.

Also, the multiplexers 721-0-721-3 receive the refresh request signal 619. When the refresh request signal 619 is logic "high", the multiplexers 721-0-721-3 select the internal address bit signals 755-0-755-3 and when the refresh request signal 619 is logic "0", the multiplexers 721-0-721-3 select the external address bit signals 757-0-757-3. The selected address bit signals "SeAd[0:3]" 722-0-722-3 included in the selected address signal 646 from the multiplexers 721-0-721-3 are fed to 16 AND gates 764-1-764-16 included in the address decoder 631. The AND gates 764-1-764-16 provide 16 decoded address bit signals "DeAd[:16]" 759-1-759-16 included in the decoded address signal 671. Each of the AND gates 764-1-764-16 has four predetermined inverting or non-inverting inputs I0-I3 which are the same as those of the AND gates 371-1-371-16 shown in FIG. 5.

Figure 15:
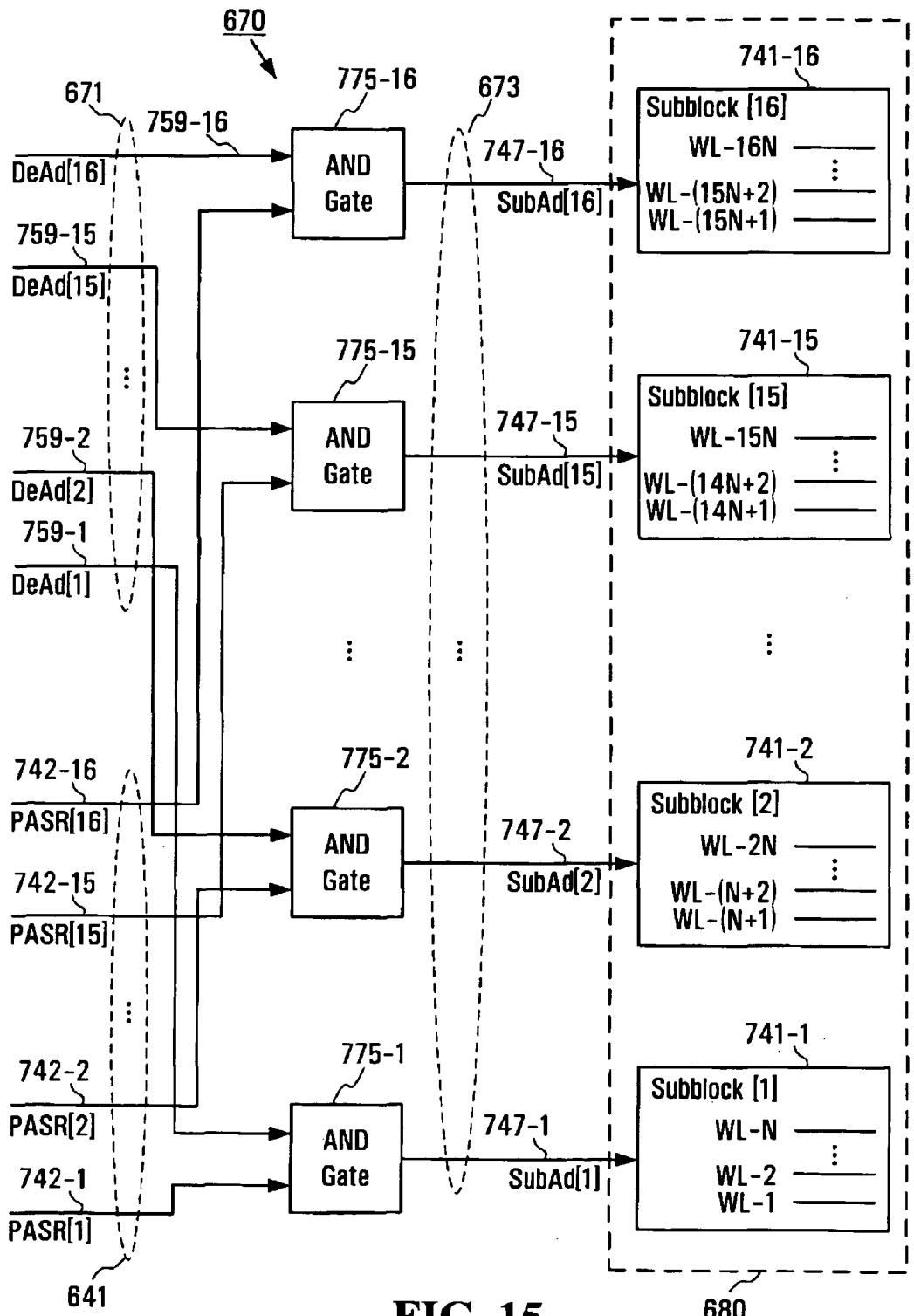
FIG. 15 is a schematic diagram illustrating a detailed circuit of a subblock selectors and a memory shown in FIG. 12.

FIG. 15 shows a detailed circuit of the subblock selector 670 and the memory 680 shown in FIG. 12. Referring to FIG. 15, the subblock selector 670 includes 16 AND gates 775-1-775-16, each having two inputs. One inputs of the AND gates 775-1-775-16 receive the decoded address bit signals "DeAd[1:16]" 759-1-759-16, respectively. Similarly, the other inputs of the AND gates 775-1-775-16 receive the PASR bit signals 742-1-742-16, respectively. The logic outputs from the AND gates 775-1-775-16 are 16 subblock bit signals 747-1-747-16 included in the subblock address signal 673. The subblock addresses SubAd[1:16] represented by the 16 subblock bit signals 747-1-747-16 are fed to the 16 subblocks 741-1-741-16 of the memory 680, respectively. The 16 subblocks 741-1-741-16 form as a memory having a plurality of wordlines, bitlines and data cells. In this embodiment, the memory is divided to the 16 subblocks 741-1 - - - 741-16. Thus, the subblock 741-1 has wordlines WL-1-WL-N. The subblock 741-2 has wordlines WL-(N+1)-WL-2N. The subblock 741-15 has wordlines WL-(14N+1)-WL-15N. The subblock 741-16 has wordlines WL-(15N+1)-WL-16N. The PASR configuration register 621 generates 16 different signal bits, that is, the PASR signal 641 "PASR[1:16]". The 16-bit signals enable or disable any one of the 16 memory subblocks including the subblocks 741-11-741-16 through the subblock selector 670.

Figure 16:
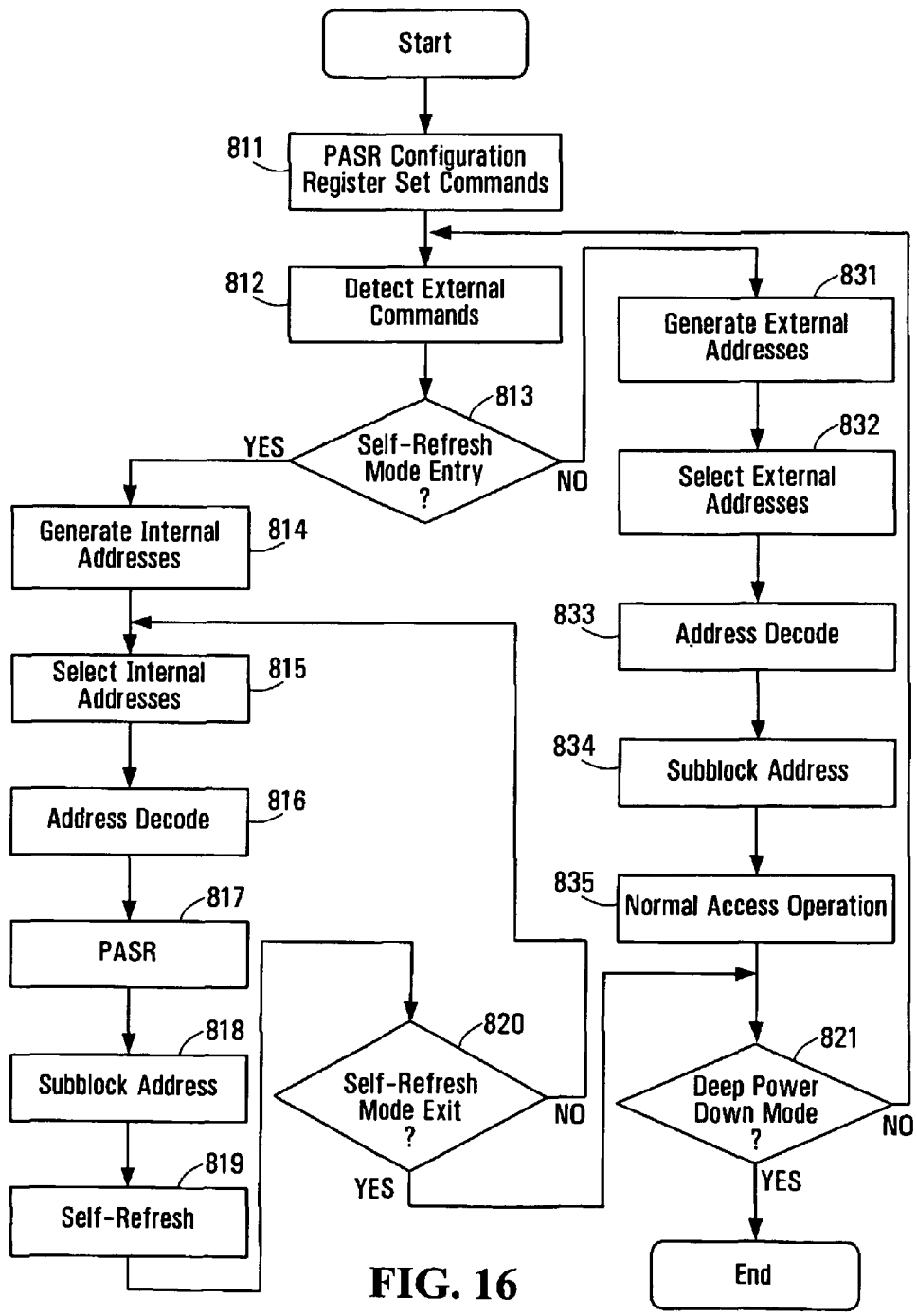
FIG. 16 is a flowchart illustrating the operation of the DRAM device shown in FIG. 12.

FIG. 16 shows the operation of the DRAM device shown in FIG. 12. Referring to FIGS. 12-16, in the operation mode, the memory controller (not shown) provides the subblock selection input data DIN[1:16] as the data input signal 637 to the DRAM device (i.e., the PASR configuration register 621). The subblock selection input data DIN[1:16] is provided and the PASR configuration register set commands are latched in the D-FFs 745-1-745-16 (step 811). The command decoder 612 of the external command controller 611 decodes the commands of the command signal 615 (step 812). In a case where a self-refresh entry command is detected (YES at step 813), the refresh request signal 619 is provided by the external command controller 611. In response to the refresh request signal 619, the internal address counter 623 generates the four-bit internal address signal 645 ("IA[0:3]") including the four internal address bit signals 755-0-755-3 (step 814). The address selector 629 having the multiplexers 721-0-721-3 selects IA[0:3] and provides it as the selected addresses SeAd [0:3] represented by the four selected address bit signals 722-0-722-3 of the selected address signal 646 (step 815).

The selected addresses SeAd[0:3] are decoded by the address decoder 631 including the 16 AND gates 764-1-764-16 and the decoded addresses DeAd[1:16] represented by the 16 decoded address bit signals 759-1-759-16 of the decoded address signal 671 are provided (step 816).

The subblock selection input data DIN[1:16] are already latched in the 16 D-FFs 745-1-745-16 of the PASR configuration register 621 (step 811) and the PASR configuration register 621 produces the PASR signal 641 (step 817). The subblock selector 670 (the AND gates 775-1-775-16) provides 16 subblock address bit signals 747-1-747-16 (the subblock addresses "SubAd[1:16]" of the subblock address bit signals 747-1-747-16) based on the decoded addresses DeAd [1:16] and the PASR settings PASR[1:16]. The subblocks 741-1-741-16 of the memory 680 are selected in accordance with the subblock addresses SubAd[1:16] (step 818). Then, the self-refresh operation is performed (step 819). If no self-refresh exit command is detected (NO at step 820), the above operations at steps 815-819 are repeated. If a self-refresh exit command is detected (YES at step 820), then it will be determined whether the DRAM device enters into a deep power down mode (step 821). If no deep power down command is detected by the command decoder 612 (NO at step 821), the operation will return to step 812 and the above operations will be repeated. If a deep power down mode enters (YES at step 821), the DRAM device will be disabled.

When no self-refresh entry is detected (NO at step 813), the external address latch 653 provides the external addresses EA[0:3] represented by the external address signal 657 (step 831). The address selector 629 selects the external address signal 657 (step 832) and provides the selected address signal 646 (as the decoded address DeAd[1:16]) (step 833). The subblock selector 670 provides the subblock addresses SubAd[1:16] represented by the subblock address signal 673 (step 834). Then, the normal access operation is performed (step 835). Thereafter, it is determined whether the DRAM device enters a deep power down mode (step 821).

In above embodiments, the refresh operation in DRAM devices is a "self-refresh". However, the partial array refresh scheme described above is also applicable to a normal refresh. Implementation of fully independent partial array refresh scheme into DRAM control logic or programs maximizes the flexibility of memory cell array usage between normal access modes and refresh/self-refresh access modes. In the application of the normal refresh, the PASR configuration and function become as PAR (partial array refresh) configuration and function. The embodiment DRAM devices have advantages of flexibility of memory array block selection, any combination of arrays for refresh and self-refresh. User selectable arrays for data retention provide effective memory control, especially for low power mobile application.

The embodiments described above may have further various variations. The number of subblocks of a memory is not limited to 16. A memory may be divided by M subblocks (M is an integer greater than one). It is, thus, at least M values of the subblock selection input data DIN are required for the PASR or PAR signal to designate the M subblocks. The address signals are not limited to four-bit signals. N (an integer) bits are required for addressing the M subblocks.

In the above described embodiments, the signals are active "high" logic signals. The signals may, however, be active "low" signals, according to design preferences. The logic "high" and "low" states of the signals may be represented by the low and high supply voltages VSS and VDD, respectively. Also, the voltages with the DRAM device operates may be voltages derived from the "high" and "low" supply voltages VDD and VSS. PASR or PAR signals can be active "low" as well as active "high". A PASR or PAR configuration register can have address signals as register data. Dynamic decoding scheme can be used for decoders.

In the embodiments described above, the device elements and circuits are connected to each other as shown in the figures, for the sake of simplicity. In practical applications of the present invention to semiconductor ICs and DRAM devices, elements, circuits, etc. may be connected directly to each other. As well, elements, circuits etc. may be connected indirectly to each other through other elements, circuits, etc., necessary for operation of the semiconductor ICs and DRAM devices. Thus, in actual configuration of semiconductor ICs and DRAM devices, the circuit elements and devices are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A dynamic random access memory (DRAM) device comprising:
   M memory, M being an integer greater than one, each having a plurality of wordlines, each wordline being connected to a plurality of data store cells, the cells being refreshable by a refresh operation; and
   a register for controlling, in a self-refresh mode, the refreshing of each of the M memory banks independently from each other;
   wherein:
   the register contains a respective bit for each memory bank which indicates whether or not, in a self-refresh mode, the memory bank is to be refreshed;
   in self-refresh mode, the DRAM device performs a self-refresh operation only for the memory banks for which the respective bit in the register is set to indicate self-refresh.

2. The DRAM device of claim 1, wherein the register comprises:
   M latches, wherein each latch controls the refreshing of a respective one of the M memory banks.

3. A method for refreshing a dynamic random access memory device (DRAM) including M memory banks, M being an integer greater than one, each bank having a plurality of wordlines, each wordline being connected to a plurality of data store cells, the cells being refreshable in a self-refresh mode, the method comprising:
   controlling, in the self-refresh mode, the refreshing of each of the M memory banks independently from each other by:
   storing in a register a respective bit for each memory bank which indicates whether or not, in a self-refresh mode, the memory bank is to be refreshed;
   in self-refresh mode, performing a self-refresh operation only for the memory banks for which the respective bit in the register is set to indicate self-refresh.

4. The method of claim 3, wherein the step of controlling comprises:
   configuring M bank refresh data in response to input data, the M bank refresh data being independently set by the input data, each of the M bank refresh data controlling the refreshing at a respective one of the M memory banks.

5. A refresh controller for use in a dynamic random access memory (DRAM) device selectively operable in a self-refresh mode or a non self-refresh mode, the DRAM device including M memory banks, M being an integer greater that one, each banks having a plurality of wordlines, each wordline being connected to a plurality of data store cells, the cells being refreshable in the self-refresh mode, the refresh controller comprising:
   refresh circuitry for controlling, in the self-refresh mode, the refreshing of the memory banks independent from each other in accordance with M bank refresh data, the refresh circuitry comprising:
   a register containing a respective bit for each memory bank which indicates whether or not, in a self-refresh mode, the memory bank is to be refreshed;
   wherein in self-refresh mode, the refresh controller controls a self-refresh operation to occur only for the memory banks for which the respective bit in the register is set to indicate self-refresh.

6. The refresh controller of claim 5, further comprising:
   configuration circuitry for configuring the M bank refresh data in response to input data wherein each of the M bank refresh data corresponds to a respective one of the M memory banks.

* * * * *